United States Patent
Hao et al.

(10) Patent No.: US 7,235,451 B2
(45) Date of Patent: Jun. 26, 2007

(54) DRAIN EXTENDED MOS DEVICES WITH SELF-ALIGNED FLOATING REGION AND FABRICATION METHODS THEREFOR

(75) Inventors: Pinghai Hao, Plano, TX (US); Shanjen Pan, Plano, TX (US); Sameer Pendharkar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/378,402

(22) Filed: Mar. 3, 2003

(65) Prior Publication Data

US 2004/0173859 A1 Sep. 9, 2004

(51) Int. Cl.
*H01L 21/336* (2006.01)

(52) U.S. Cl. .................. 438/306; 438/301; 438/305

(58) Field of Classification Search ............... 257/408, 257/343, 492, 493; 438/140, 301–303, 305–307
See application file for complete search history.

(56) References Cited

U.S. PATENT DOCUMENTS

| | | | |
|---|---|---|---|
| 5,406,110 A | 4/1995 | Kwon et al. | |
| 5,501,994 A | 3/1996 | Mei | |
| 6,071,768 A | 6/2000 | Duvvury et al. | |
| 6,160,289 A | 12/2000 | Kwon et al. | |
| 6,160,290 A | 12/2000 | Pendharkar et al. | |
| 6,211,552 B1 | 4/2001 | Efland et al. | |
| 6,225,673 B1 | 5/2001 | Pendharkar et al. | |
| 6,404,012 B1 * | 6/2002 | Takahashi | 257/343 |
| 6,424,005 B1 | 7/2002 | Tsai et al. | |
| 6,441,431 B1 | 8/2002 | Efland et al. | |
| 6,468,837 B1 | 10/2002 | Pendharkar et al. | |
| 6,614,089 B2 * | 9/2003 | Nakamura et al. | 257/492 |

* cited by examiner

*Primary Examiner*—Hung Vu
(74) *Attorney, Agent, or Firm*—Jaqueline J. Garner; W. James Brady, III; Frederick J Telecky, Jr.

(57) ABSTRACT

Semiconductor devices and manufacturing methods therefor are disclosed, in which a drain-extended MOS transistor comprises a self-aligned floating region proximate one end of the transistor gate and doped with a first type dopant to reduce channel hot carrier degradation, as well as an oppositely doped first source/drain laterally spaced from the first end of the gate structure in a semiconductor body. The device may further comprise a resurf region doped to a lower concentration than the floating region to facilitate improved breakdown voltage performance. A method of fabricating a drain-extended MOS transistor in a semiconductor device is disclosed, comprising providing first dopants to a floating region in a semiconductor body, which is self-aligned with the first end of a gate structure, and providing second dopants to source/drains of the semiconductor body, wherein the first and second dopants are different.

5 Claims, 6 Drawing Sheets

DRAIN EXTENDED MOS DEVICES WITH SELF-ALIGNED FLOATING REGION AND FABRICATION METHODS THEREFOR

FIELD OF INVENTION

The present invention relates generally to semiconductor devices and more particularly to drain-extended MOS devices with self-aligned floating regions and methods for fabricating the same.

BACKGROUND OF THE INVENTION

MOS and other types of transistors are found in many modern semiconductor products where switching and/or amplification functions are needed. Many manufacturing processes and techniques have been developed for forming MOS transistors in semiconductor substrate materials such as silicon and the like. In recent years, the size of transistors and other components have steadily decreased to submicron levels in order to facilitate higher device densities in semiconductor products. At the same time, many applications of such devices have created a need to operate the semiconductor devices at lower power and voltage levels. Accordingly, efforts continue to be made to design semiconductor devices, such as MOS transistors, which consume less power and operate at lower voltages, particularly for logic circuitry.

However, many applications continue to require transistors which operate at higher voltage levels, in addition to those devices designed to operate at low voltages. For example, semiconductor products are often required to interface with equipment such as printers, control systems, or the like, which generate signals at relatively high voltage levels, such as 12 volts DC or higher. In these situations, it is desirable to fabricate transistors designed for low power consumption and low voltage operation, as well as those designed for higher voltages, in a single semiconductor device or product.

For transistors designed for higher power applications, a particular design is often a tradeoff between breakdown voltage and drain-to-source on state resistances ($RDS_{ON}$). Breakdown voltage (BVdss) is often measured as drain-to-source breakdown voltage with the gate and source shorted together. Where high breakdown voltage is needed, drain-extended MOS transistors are often employed, in which one of the source/drain regions is spaced from the gate to provide a drift region or drain extension in the semiconductor material therebetween. The spacing of the drain and the gate spreads out the electric fields thereby increasing the breakdown voltage of the device. However, the drain extension increases the resistance of the drain-to-source current path. In conventional drain-extended MOS devices, the $RDS_{ON}$ and breakdown voltage are thus inversely proportional, wherein the drain extension causes an increase in $RDS_{ON}$, thus limiting the drive current rating of the device.

Another problem in MOS transistors is channel hot carrier (CHC) degradation, caused by high electric fields in the channel region of the substrate. High drain currents may ionize electrons and holes through impact ionization, causing injection of hot carriers (electrons and/or holes) into the transistor gate oxide above the silicon substrate. Some of the injected carriers remain in the gate material, which leads to performance degradation and/or device damage, such as a shift in threshold voltage, changed transconductance, and/or changed drain current capability. These channel hot carrier effects thus reduce the operational lifetime of the device. During junction breakdown conditions in conventional drain-extended MOS transistors, the junction breakdown typically occurs near the drain-side end or edge of the gate structure. As a result, CHC degradation is more pronounced at this part of the gate. There remains a need for improved MOS transistor devices and manufacturing techniques for increasing the breakdown voltage and for reducing channel hot carrier degradation, without significant increase in $RDS_{ON}$.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. The invention relates to drain-extended MOS transistor devices and manufacturing methods therefor, in which a self-aligned floating region is provided near one or both ends of the gate, for example, the drain-side end of the gate, which is doped with a first type dopant. The floating region may be tailored to shift the breakdown away from the gate edge downward into the semiconductor body, thereby reducing or mitigating channel hot carrier (CHC) degradation of the device. The device may further comprise a resurf region doped to a lower concentration than the floating region to facilitate increased breakdown voltage performance, wherein the presence of the more highly doped floating region may operate to mitigate the increase in $RDS_{ON}$. The invention may thus facilitate improved breakdown performance and increased product lifetime by providing better tradeoff between hot carrier degradation, $RDS_{ON}$ and breakdown voltage.

In one aspect of the invention, a drain-extended MOS transistor is provided, comprising a gate structure overlying a channel region of a semiconductor body, and a floating region proximate the channel region in the semiconductor body near one end of the gate, where the transistor may be an NMOS or a PMOS type device. In the exemplary implementations illustrated and described below, the floating region is self-aligned with the end of the gate structure. The floating region is doped with first type dopants, where an oppositely doped source/drain is laterally spaced from the end of the gate structure. A resurf region may also be formed between the spaced source/drain and the floating region, comprising first type dopants of a lower concentration than that of the floating region.

In another aspect of the invention, a method is provided for fabricating a drain-extended MOS transistor in a semiconductor device, comprising forming a gate structure and providing first dopants to a floating region of a semiconductor body, where the floating region is self-aligned with a first end of the gate structure. Second dopants are provided to first and second source/drain regions of the semiconductor body, where the first source/drain region is laterally spaced from the first end of the gate structure. The methods may be employed in fabricating drain-extended NMOS and/or PMOS transistors in a substrate such as a silicon or SOI wafer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
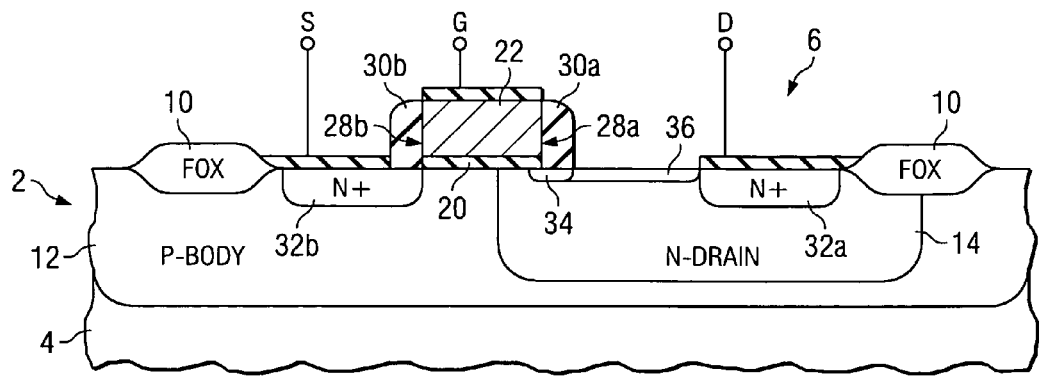
FIG. 1A is a partial side elevation view in section illustrating an exemplary drain-extended NMOS transistor comprising a self-aligned floating region in accordance with an aspect of the present invention.

One or more exemplary implementations of the present invention are described below with reference to the attached drawings, wherein like reference numerals are used to refer to like elements throughout. The invention relates to drain-extended semiconductor devices and manufacturing methods therefor, in which a doped floating region is provided near one end of a MOS transistor gate to mitigate CHC degradation. In the following description and drawings, several illustrative examples are provided, in which various aspects of the invention are implemented in the context of drain-extended NMOS and/or PMOS transistor devices. However, the invention is not limited to the illustrated examples. For instance, although illustrated and described below in conjunction with asymmetrical drain-extended MOS devices, the various aspects of the invention, including self-aligned floating regions, may be incorporated into symmetrical transistor designs, such as where both source and drain sides have self-aligned floating regions and drain extensions.

Figure 1B:
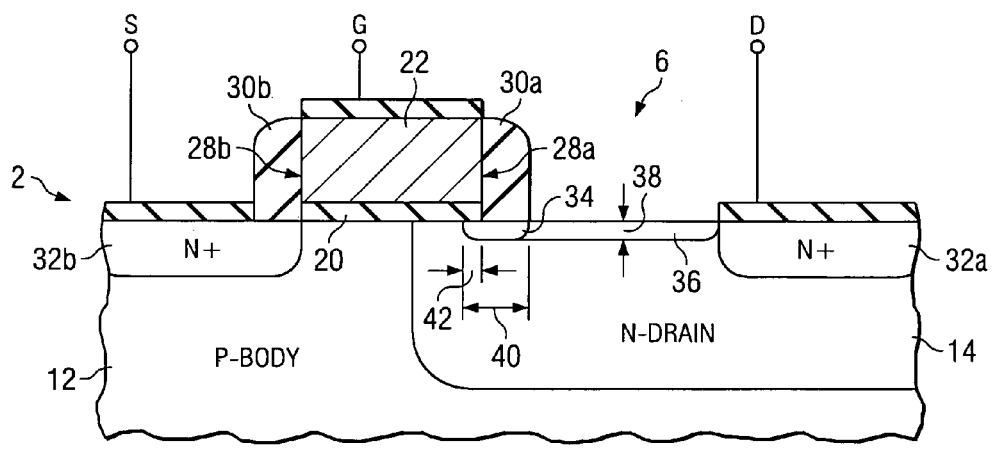
FIG. 1B is a partial side elevation view in section illustrating further details of the NMOS transistor of FIG. 1A.

Referring initially to FIGS. 1A and 1B, a semiconductor device 2 is illustrated at an intermediate stage of fabrication prior to metalization processing. The device 2 comprises an exemplary drain-extended NMOS transistor (e.g., DENMOS) 6, where the NMOS transistor 6 comprises a self-aligned floating region 34 in accordance with an aspect of the present invention. The device 2 also includes an exemplary drain-extended PMOS transistor 8, illustrated and described below with respect to FIG. 1C. It is noted that the exemplary devices and structures illustrated and described herein are not exhaustive of all the devices possible within the scope of the invention and the appended claims, and that the devices illustrated herein are not necessarily drawn to scale.

The NMOS transistor 6 in FIGS. 1A and 1B comprises a semiconductor body 4, such as a silicon substrate or other semiconductor substrate, or a layer of silicon or other semiconductor deposited over an insulator in an SOI device wafer. In the illustrated example, the semiconductor body 4 is a lightly doped p-type silicon substrate, although the invention may be carried out using any type of semiconductor body. Isolation structures 10 are formed in the body 4 to separate and provide electrical isolation between active areas in the body 4. Any isolation structures 10 may be used, including but not limited to field oxide (FOX) structures formed using LOCOS or other techniques, and shallow trench isolation (STI) structures. The illustrated portion of the device 2 further includes a p-body or p-well 12 and an n-drain or n-well 14 formed in the semiconductor body 4.

A gate structure is formed over a channel region of the semiconductor body 4, comprising a gate oxide 20 formed over the semiconductor 4 and a polysilicon gate 22 overlying the gate oxide 20, where a silicide gate contact (e.g., gate G) is formed over a top surface of the polysilicon gate 22. The poly gate and drain contact regions can be silicided or non-silicided within the scope of the invention, wherein the drain extension region preferably is not silicided. The gate structure comprises first and second opposite ends 28a and 28b, respectively, with sidewall spacers 30a and 30b extending laterally outward from the first and second ends 28a and 28b, respectively. A first source/drain 32a is formed in the n-well 14 laterally spaced from the first end 28a of the gate structure in the semiconductor body 4 (e.g., an extended drain) with a silicide drain contact D, where the first source/drain 32a comprises n-type dopants, such as phosphorus (P), arsenic (As), antimony (Sb), etc. A second source/drain 32b (e.g., source) is formed of n-type dopants in the p-body 12 proximate the second gate end 28b, with a silicide source contact S formed over the n-doped source 32b. Although the exemplary transistor 6 is illustrated with the source 32b formed near the second end 28b of the gate structure, other implementations are possible where both the source 32b and the drain 32a are spaced from the respective ends 28 of the gate structure, wherein floating regions 34 are provided at one or both gate ends, and all such implementations are contemplated as falling within the scope of the invention and the appended claims.

In accordance with an aspect of the invention, a floating region 34 is formed in the n-drain 14 of the semiconductor body 4 proximate the first gate end 28a, which is doped with boron (B) or other p-type dopants in the drain-extended NMOS transistor 6. The exemplary NMOS transistor 6 also comprises a reduced surface field (e.g., resurf) region 36 extending between the floating region 34 and the first source/drain 32a in the semiconductor body 4, where the resurf region 36 comprises p-type dopants of a lower concentration than that of the floating region 34. The floating and resurf regions 34 and 36 are generally of the same depth 38 (FIG. 1B), such as a few hundred angstroms in this example, although the regions 34 and 36 may be of any depth, and may be of different depths. In the illustrated example, moreover, the floating region 34 is self-aligned with the first gate end 28a, having a lateral width 40, with one end generally coextensive with the outer edge of the sidewall spacer 30a and another end extending under the gate dielectric 20 by a small distance 42, where the distance 42 may be zero.

Transistors in accordance with this aspect of the invention may include a floating region, such as the region 34, alone or in combination with the resurf region 36. In operation, the floating region 34 helps to reduce or mitigate channel hot carrier (CHC) degradation of the transistor 6, wherein the addition of the resurf region (e.g., lightly p-doped in this example) operates to spread out electric field lines so as to increase the breakdown voltage of the transistor 6. It is noted that the doping level in the resurf region 36 affects the breakdown voltage as well as the drive current capability of the transistor 6, wherein higher resurf doping increases breakdown voltage while also increasing the drain-to-source 'on' state resistance ($RDS_{ON}$), thereby reducing the drive current performance. However, the floating region 34 operates to move the breakdown away from the edge of the gate structure and down into the semiconductor body 4, whereby CHC degradation is mitigated. In addition, the self-alignment of the floating region 34 facilitates control of the overlap between the gate and the floating region 34 (e.g., the overlap distance 42 in FIG. 1B). Where this overlap is not controlled, the $RDS_{ON}$ parameter may be higher in worst case. Therefore, the self-alignment aspects of the invention may be employed to mitigate the increase in $RDS_{ON}$, such that advantageous tradeoff can be achieved between CHC degradation, $RDS_{ON}$ (current drive capability), and breakdown voltage in the drain-extended NMOS transistor 6.

Figure 1C:
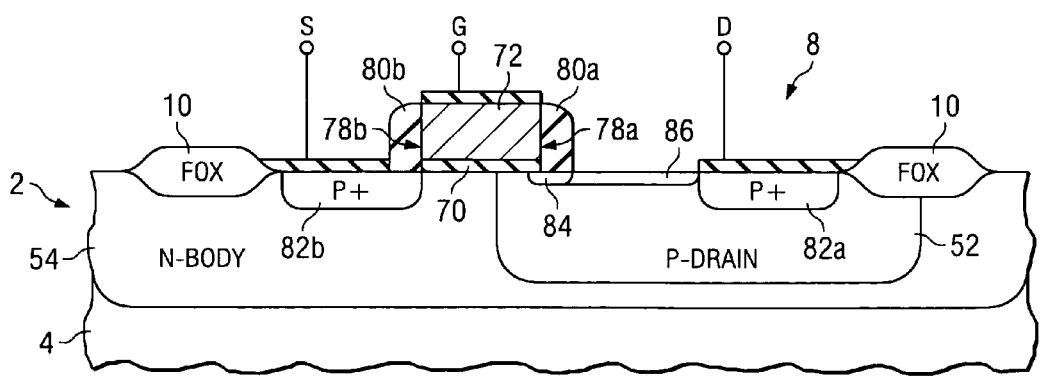
FIG. 1C is a partial side elevation view illustrating an exemplary drain-extended PMOS transistor comprising a self-aligned floating region in accordance with the invention.

The invention may also be employed in association with drain-extended PMOS type transistors. FIG. 1C illustrates an exemplary drain-extended PMOS transistor 8 in the semiconductor device 2, where the illustrated portion of the device 2 includes an n-body or n-well 54 and a p-drain or p-well 52 formed in the semiconductor body 4. The transistor 8 comprises a gate oxide 70 and a polysilicon gate 72, with a silicide gate contact G formed over the polysilicon gate 72, where the gate structure comprises first and second opposite ends 78a and 78b, respectively. Sidewall spacers 80a and 80b extend laterally outward from the first and second ends 78a and 78b, respectively. An extended drain 82a is formed in the p-drain 52 laterally spaced from the first gate end 78a with a silicide drain contact D, where the drain 82a comprises p-type dopants. A source 82b is formed of p-type dopants in the n-body 54 proximate the second gate end 78b, having a silicide source contact S. An n-doped floating region 84 is formed in the p-drain 52 proximate the first gate end 78a, and the transistor 8 also comprises an n-doped resurf region 86 extending between the floating region 84 and the extended drain 82a, where the concentration of n-type dopants in the resurf region 86 is less than that in the floating region 84. In the exemplary PMOS transistor 8, the floating region 84 is self-aligned with the first gate end 78a, with one end being generally coextensive with the outer edge of the sidewall spacer 80a and another end extending under the gate dielectric 70 by a small distance.

Figure 2A:
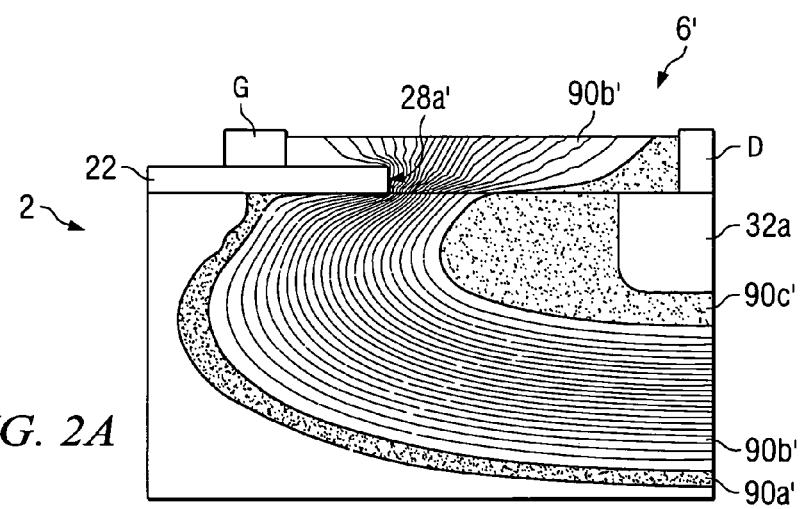
FIG. 2A is a partial side elevation view in section illustrating electric potential lines in a drain-extended NMOS transistor having no floating region at breakdown.

Referring also to FIGS. 2A, 2B, 3A, and 3B, exemplary simulated potential lines (FIGS. 2A and 2B) and electric field plots (FIGS. 3A and 3B) are illustrated for a drain-extended NMOS transistor 6' having no floating region (FIGS. 2A and 3A) and for the exemplary drain-extended NMOS transistor 6 having a floating region 34 and a resurf region 36 (FIGS. 2B and 3B), respectively. FIG. 2A illustrates electric potential lines in a drain-extended NMOS transistor 6' having no floating region at breakdown, where the transistor threshold voltage (Vt) is about 1.2 V, the drain current (Id) is about 287 uA/um, the specific drain-to-source resistance Rsp (e.g., $RDS_{ON}$) is about 0.335 mOHM*cm², and the breakdown voltage BVdss is about 23.3 V (e.g., drain-to-source breakdown voltage with the gate shorted to the source). Under these conditions, the electric potential between a lowest potential region 90a' and a highest potential region 90c' is illustrated with intermediate potential lines plotted, including a mid-potential line 90b'. As can be seen in FIG. 2A, the potential lines are crowded near the drain-side gate end 28a'.

Figure 2B:
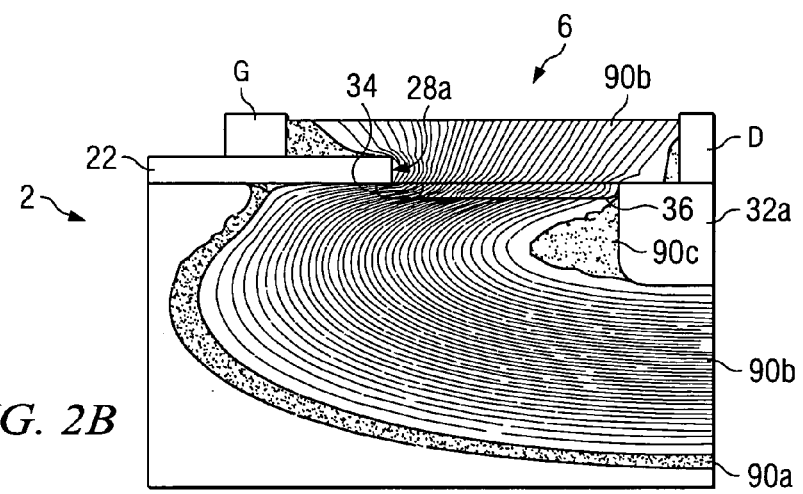
FIG. 2B is a partial side elevation view in section illustrating electric potential lines in the exemplary drain-extended NMOS transistor of FIGS. 1A and 1B comprising a self-aligned floating region at breakdown.

FIG. 2B shows the exemplary drain-extended NMOS transistor 6 having the floating region 34 and the resurf region 36 with a Vt of about 1.2 V, Id of about 243 uA/um, Rsp of about 0.458 mOHM*cm², and BVdss of about 36.8 V. Under these conditions, the electric potential between a lowest potential region 90a and a highest potential region 90c is illustrated with intermediate potential lines plotted, including a mid-potential line 90b. The inclusion of the p-doped floating region 34 and resurf region 36, results in the density of potential lines near the gate end 28a being significantly lower than in the device 6' of FIG. 2A. In this case, the breakdown voltage is significantly increased (e g., from 23.3 V to about 36.8 V) with only a slight reduction in drain current (e.g., from 287 uA/um to about 243 uA/um).

Figure 3A:
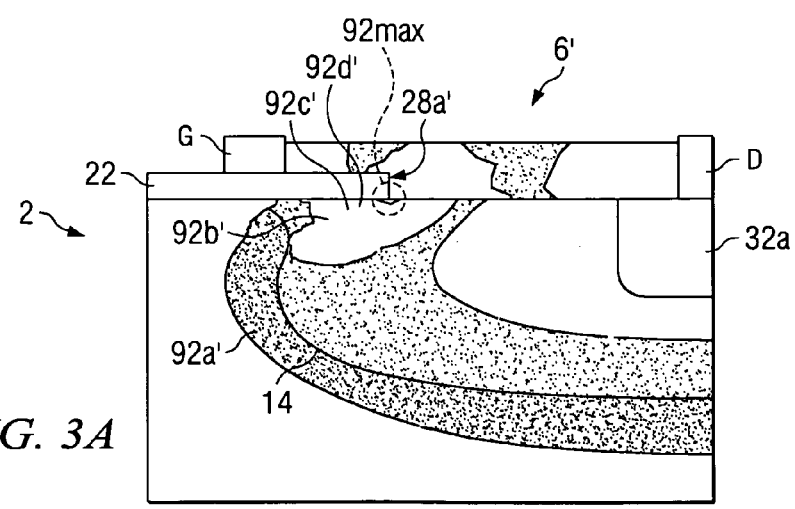
FIG. 3A is a partial side elevation view in section illustrating an electric field plot in the drain-extended NMOS transistor of FIG. 2A having no floating region at breakdown.
Figure 3B:
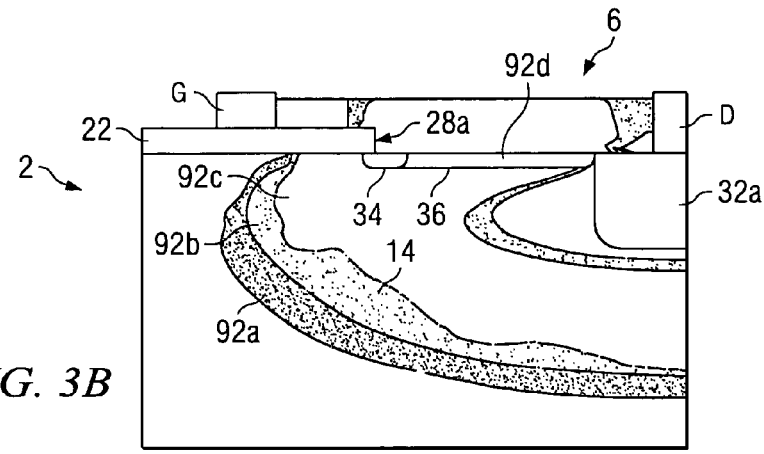
FIG. 3B is a partial side elevation view in section illustrating an electric field plot in the exemplary drain-extended NMOS transistor of FIGS. 1A, 1B, and 2B comprising a self-aligned floating region at breakdown.

FIG. 3A illustrates an electric field plot in the transistor 6' (e.g., no floating or resurf regions) under the above conditions (Vt is about 1.2 V, Id is about 287 uA/um, Rsp is about 0.335 mOHM*cm², and BVdss is about 23.3 V). In FIG. 3A, electric field regions 92' are illustrated beginning with a low field strength region 92a' and successively higher field strength regions 92b', 92c', 92d40 , and 92max, where the highest electric field strength 92max is found near the drain-side gate edge 28a'. The inventors have appreciated that the high field strength near the gate edge 28a' corresponds to high probability of CHC degradation, and hence lowered life expectancy for the transistor 6'. However, for the exemplary transistor 6 having the floating region 34 and the resurf region 36 in FIG. 3B, the electric field strength at the drain-side end 28a of the gate 22 is much lower than for the transistor 6' in FIG. 3A. In FIG. 3B (Vt of about 1.2 V, Id of about 243 uA/um, Rsp of about 0.458 mOHM*cm², and BVdss of about 36.8 V), progressively higher field strength regions 92a, 92b, 92c, and 92d are illustrated, having field strength values similar to the regions 92a', 92b', 92c', and 92d' in FIG. 3A. As can be seen in FIG. 3B, lower fields occur near the gate 22 during breakdown, by which CHC degradation is reduced in the transistor 6.

Figure 4:
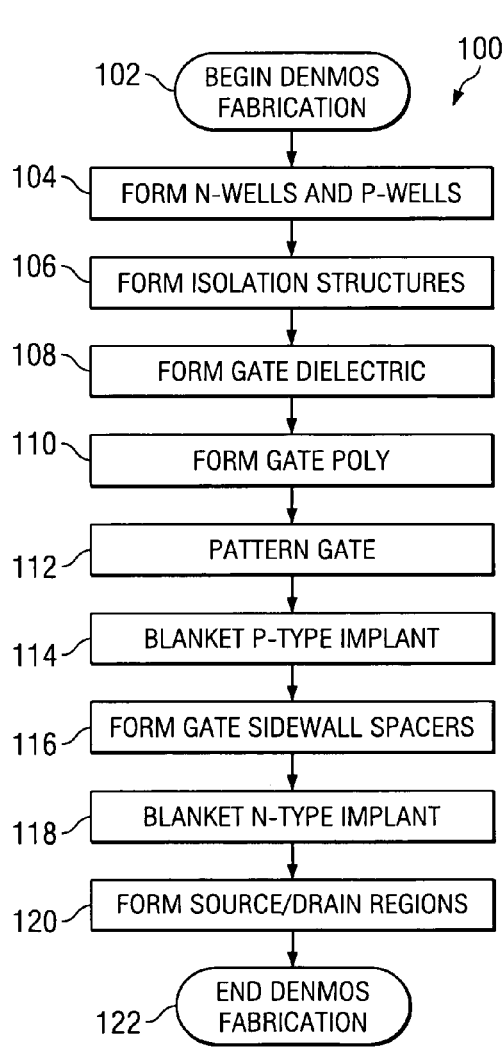
FIG. 4 is a flow diagram illustrating an exemplary method of fabricating a drain extended MOS device in accordance with another aspect of the invention.
Figure 6:
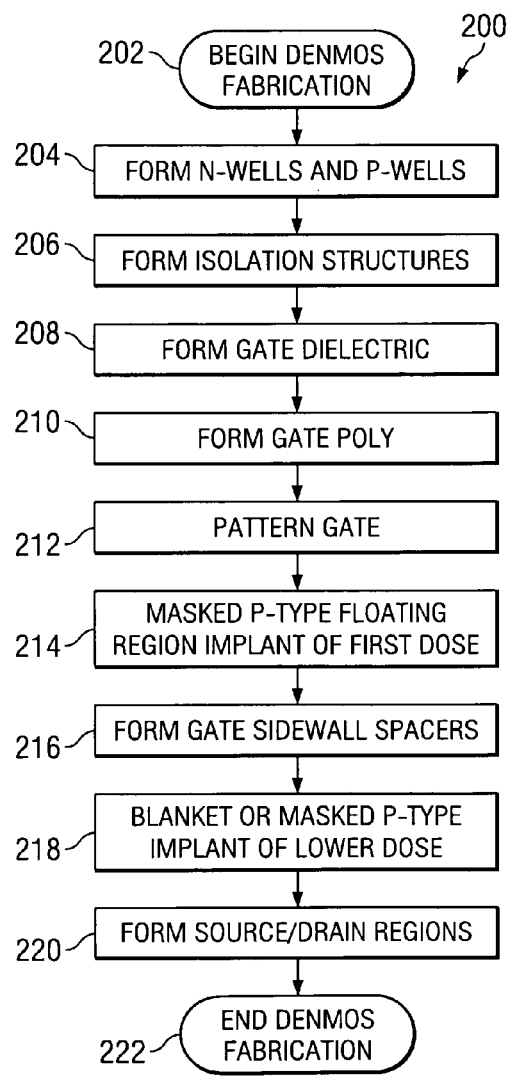
FIG. 6 is a flow diagram illustrating another exemplary method of fabricating a drain extended MOS device in accordance with the invention.

Another aspect of the invention provides methods for fabricating drain-extended MOS transistors in a semiconductor device. One exemplary method 100 is illustrated in FIG. 4 in accordance with this aspect of the invention. Although the method 100 and other methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

In one example, the exemplary method 100 may be employed to fabricate the exemplary NMOS transistor 6 illustrated and described above, and further described hereinafter in conjunction with FIGS. 5A–5D. In the method 100 and other methods of the invention, a gate structure is formed and first dopants are provided to a floating region in the semiconductor body proximate the first end of the gate structure, where the floating region is self-aligned with the first end of the gate structure. Second dopants are then provided to first and second source/drains of the semiconductor body, where the first source/drain is laterally spaced from the first end of the gate structure (e.g., drain-extended). The second source/drain is proximate the second end of the gate structure, wherein one of the first and second dopants are p-type and the other of the first and second dopants are n-type. Although illustrated and described below in the context of drain-extended NMOS transistors (e.g., transistor 6), the methods of the invention are also applicable to the fabrication of drain-extended PMOS transistors, such as the exemplary PMOS transistor 8 of FIG. 1C above.

Figure 5A:
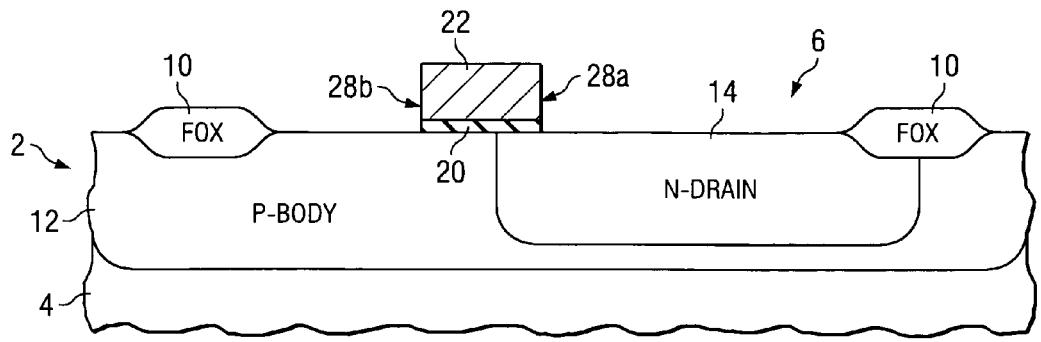
FIGS. 5A–5D are partial side elevation views in section illustrating fabrication of a drain-extended NMOS transistor having a self-aligned floating region generally in accordance with the method of FIG. 4.

Referring initially to FIGS. 4 and 5A, the method 100 begins at 102 where n-wells and/or p-wells are formed at 104 in a semiconductor body, using any suitable implantation, diffusion, or other well fabrication techniques. Thus, in the drain-extended NMOS transistor 6 of FIG. 5A, the n-drain or n-well 14 and the p-body or p-well 12 are formed in the semiconductor body 4 at 104. At 106, isolation structures 10 (e.g., $SiO_2$ field oxide (FOX) or shallow trench isolation (STI) structures) are formed in the body 4 to separate and provide electrical isolation between active areas in the body 4. A gate structure is then formed at 108–112 using any appropriate techniques. For example, a single or multi-layer gate dielectric is formed at 108 over the semiconductor body (e.g., gate dielectric 20 in FIG. 5A) to any appropriate thickness, which may include thermally grown $SiO_2$, and a subsequent high-k dielectric material deposition may also be performed in fabricating the gate dielectric 20. A gate contact layer (e.g., polysilicon gate contact 22 in FIG. 5A), such as polysilicon or other conductive material is then formed at 110 using any suitable deposition technique. The gate structure is patterned at 112 to form a transistor gate structure, using any appropriate masking and etching techniques, having first and second opposite ends (e.g., ends 28a and 28b).

Figure 5B:
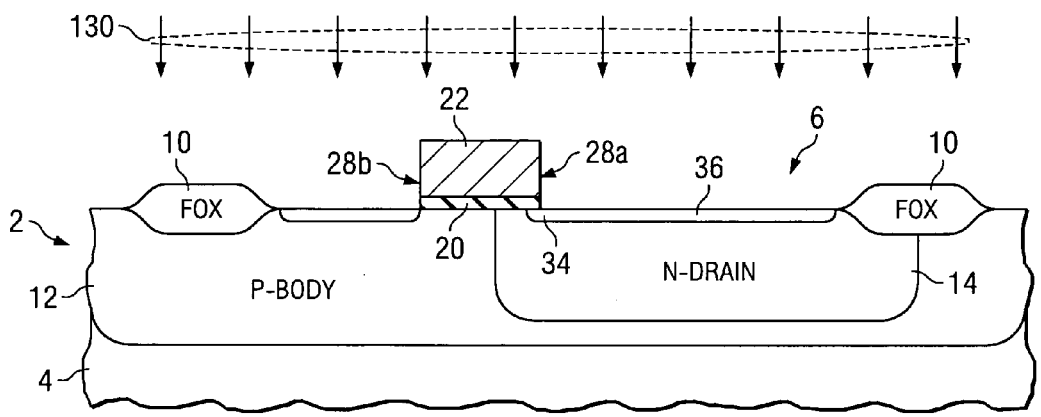
Figure 5C:
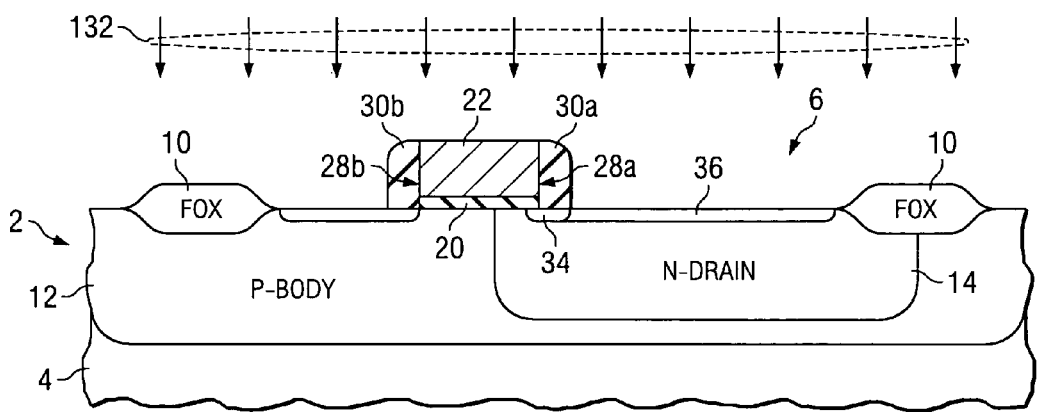
Figure 5D:
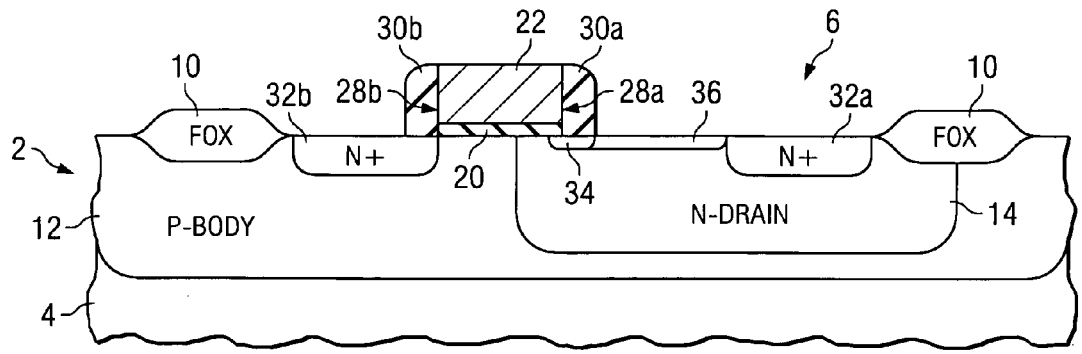

Referring also to FIG. 5B, a blanket p-type implantation process 130 is performed at 114 (e.g., implantation process 130 in FIG. 5B) to provide first dopants to a floating region in the semiconductor body proximate the first end of the gate structure (e.g., floating region 34), where the floating region is self-aligned with the first gate end. In one example, the implantation process 130 provides boron or other p-type dopants into the floating region 34 using a first implantation dose of about $2E12$ cm$^{-2}$ or more at a relatively low implantation energy of about 20 keV or less to provide a shallow p-type implantation to a depth of a few hundred angstroms. Other implantation dosages and energies may be employed at 114 within the scope of the invention, using boron or other dopant species. The blanket implant at 114 thus provides first dopants of a first concentration to the floating region 34, as well as to the other active regions of the semiconductor body, including the prospective resurf region 36 extending between the floating region 34 and a prospective first source/drain region of the semiconductor body 4.

At 116, gate sidewall spacers are formed over the semiconductor body, where a first sidewall spacer (e.g., spacer 30a in FIG. 5C) overlies at least a portion of the floating region and extends laterally outward from the first end of the gate structure. Thereafter at 118, a second implantation process 132 is performed (FIG. 5C) to implant n-type dopants into the resurf region 36 using a second implantation dose, where the second implantation dose is less than the first implantation dose. In the illustrated example, the second implantation process 132 employs a second implantation dose of about $1E12$ cm$^{-2}$ or more, which may be as high as about $2E13$ cm$^{-2}$. In one example, the second implantation dose is about $4E12$ cm$^{-2}$ or less, such as about $3E12$ cm$^{-2}$ or more and about $4E12$ cm$^{-2}$ or less.

This counter-dopes the resurf region 36 (e.g., as well as other exposed active regions) to have a net p-type dopant concentration less than the floating region 34, wherein the floating region 34 is masked by the sidewall spacer 30a during the second implantation process 132. In other implementations, the second implantation process may be performed using a mask. Thereafter at 120, source/drains are formed in the semiconductor body (e.g., source 32b and extended drain 32a in FIG. 5D) by providing second (e.g., n-type) dopants to the source drain regions 32a and 32b using any suitable implantation process, which may employ a mask. The MOS fabrication method 100 then ends at 122, after which interconnect and other back-end processing (not shown) may be performed to interconnect the drain-extended NMOS transistor 6 and other electrical components in the device 2.

In the above method 100, the floating region 34 is lightly doped together with the resurf region 36, and the resurf region 36 is then counter-doped to achieve a net p-type dopant concentration lower than that of the floating region 34. The inventors have appreciated that the relative dopant concentrations of the resurf and floating regions 36 and 34, respectively, may be tailored to achieve a desired breakdown voltage and $RDS_{ON}$, where providing lower dopant concentration in the resurf region 36 operates to spread out the voltage potential during breakdown conditions. In addition, the higher dopant concentration in the floating region 34 shifts the breakdown fields away from the gate (e.g., and particularly away from the drain-side end of the gate) and into the semiconductor body 4 to mitigate CHC degradation and to enhance product lifetime expectancies. Further, the self-alignment of the floating region 34 facilitates control of the overlap between the gate and the floating region 34, to facilitate tradeoff between CHC degradation, $RDS_{ON}$, and breakdown voltage. In this regard, the invention contemplates floating region dopant concentrations that may be much higher than that of the resurf region 36, and further provides for drain-extended MOS transistors (NMOS and/or PMOS) having self-aligned floating regions with or without resurf regions.

Referring now to FIGS. 6 and 7A–7D, another exemplary method 200 is illustrated and described hereinafter in the context of fabricating the exemplary drain-extended NMOS transistor 6 in the semiconductor device 2 in accordance with the invention. The method 200 begins at 202, wherein p-wells and/or n-wells (e.g., p-body 12 and n-drain 14) are formed at 204 in a semiconductor body, and isolation structures (e.g., FOX, STI, or other) are formed at 206. A gate structure is then formed at 208–212, wherein a single or multi-layer gate dielectric (e.g., gate oxide layer 20) is formed at 208 over the semiconductor body, a gate contact layer (e.g., polysilicon gate contact 22 in FIG. 7A) is formed at 210 and patterned at 212 to form a transistor gate structure.

Figure 7A:
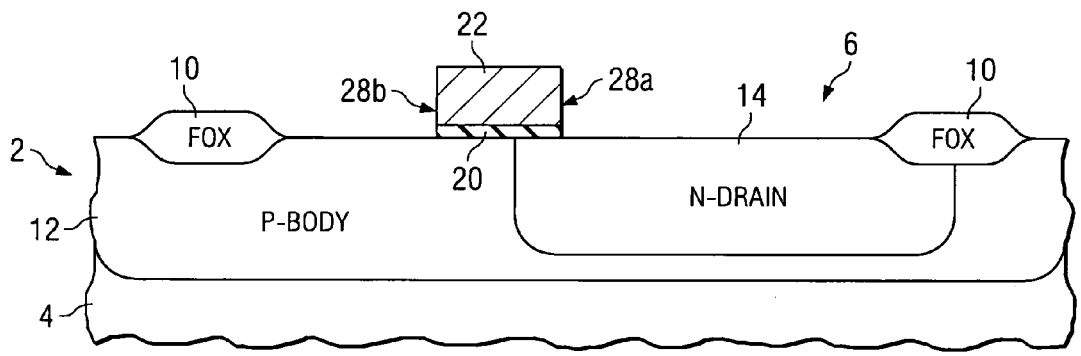
FIGS. 7A–7D are partial side elevation views in section illustrating fabrication of a drain-extended NMOS transistor having a self-aligned floating region generally in accordance with the method of FIG. 6.
Figure 7B:
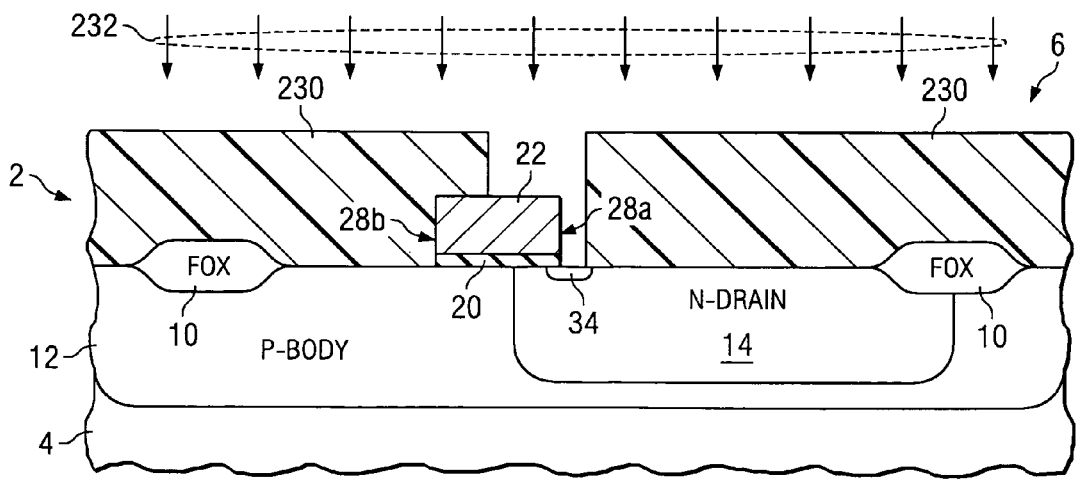
Figure 7C:
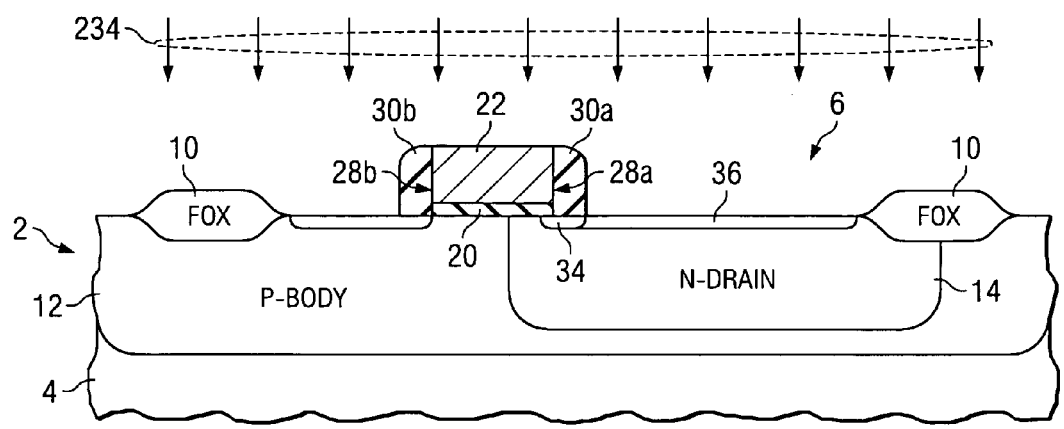
Figure 7D:
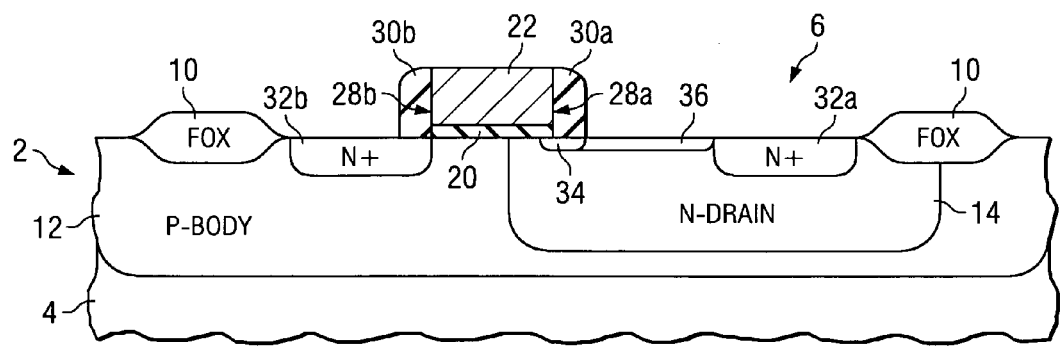

At 214, a mask 230 is formed over the device 2 (FIG. 7B), having an opening exposing the prospective floating region 34 and covering the prospective resurf region 36. As illustrated in FIG. 7B, the opening in the mask 230 may also expose a portion of the gate contact 22. A first implantation process or operation 232 is performed to provide p-type dopants into the floating region 34 using a first implantation dosage, wherein the gate structure operates as an implantation mask during the implantation 232, by which the floating region 34 is self-aligned with the gate structure. Any desired implantation dosage and energy may be employed at 214 in accordance with the invention. In one example, a first implantation dose of about $5E12$ $cm^{-2}$ or more is employed at 214, such as $4E13$ $cm^{-2}$, to implant p-type dopants to any desired depth. Thus, for instance, the first implantation process 214 may be concurrently used to implant p-type lightly-doped-drain (PLDD) regions elsewhere in the device 2, for example, to fabricate other CMOS transistors (not shown). In this regard, the mask 230 may have appropriate openings for exposing such PLDD regions during the implantation 232, wherein providing the opening for the floating region 34 adds no additional cost to the manufacturing process. Other implantation dosages and energies may be employed at 214 within the scope of the invention, using boron or other dopant species, wherein the floating region 34 is doped to a first dopant concentration.

At 216, gate sidewall spacers are formed over the semiconductor body, (e.g., spacers 30a and 30b in FIG. 7C) where a first sidewall spacer 30a overlies at least a portion of the floating region 34 and extends laterally outward from the first gate end 28a. Any materials and techniques may be employed at 216 in forming the sidewall spacers 30 in accordance with the invention. A second implantation process 234 (FIG. 7C) is performed at 218, which may but need not include masking, to implant p-type dopants into the resurf region 36 using a second implantation dose less than the first implantation dose. In the illustrated example, the second implantation process 232 employs a second implantation dose of about $1E12$ $cm^{-2}$ or more and about $5E12$ $cm^{-2}$ or less, such as about $3E12$ $cm^{-2}$ or more and about $4E12$ $cm^{-2}$ or less, at an energy of about 20 keV or less to implant p-type dopants into the resurf region 36 to a depth of a few hundred Angstroms. Thereafter, source drains are formed at 220 in the semiconductor body (e.g., source 32b and extended drain 32a in FIG. 7D) by providing second (e.g., n-type) dopants to the source drain regions 32a and 32b using any suitable implantation process, which may employ a mask (not shown). The MOS fabrication method 200 then ends at 222, after which interconnect and other back-end processing (not shown) may be performed to interconnect the drain-extended NMOS transistor 6 and other electrical components in the device 2.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a drain-extended MOS transistor in a semiconductor device, comprising:
    forming a gate structure over a semiconductor body, the gate structure having first and second opposite ends;
    providing first dopants to a floating region in the semiconductor body proximate the first end of the gate structure, the floating region being self-aligned with the first end of the gate structure;
    providing second dopants to first and second source/drains of the semiconductor body, the first source/drain being laterally spaced from the first end of the gate structure, the second source/drain being proximate to or spaced from the second end of the gate structure, wherein one of the first and second dopants are p-type and the other of the first and second dopants are n-type; and
    providing first dopants to a resurf region extending between the floating region and the first source/drain in the semiconductor body, wherein providing first dopants to the floating region comprises performing a first implantation process to implant p-type dopants into the floating region using a first implantation dose of about $2E12$ $cm^{-2}$ or more and wherein the first dopants are p-type and the second dopants are n-type;
    wherein providing first dopants to the resurf region comprises performing the first implantation process to implant p-type dopants into the floating region and the resurf region using the first implantation dose, further comprising performing a second implantation process to implant n-type dopants into the resurf region using a second implantation dose, the second implantation dose being less than the first implantation dose.

2. The method of claim 1, further comprising forming a first gate sidewall spacer over the semiconductor body before performing the second implantation process, the first gate sidewall spacer overlying at least a portion of the floating region and extending laterally outward from the first end of the gate structure.

3. A method of fabricating a drain-extended MOS transistor in a semiconductor device, comprising:
    forming a gate structure over a semiconductor body, the gate structure having first and second opposite ends;
    providing first dopants to a floating region in the semiconductor body proximate the first end of the gate structure, the floating region being self-aligned with the first end of the gate structure;
    providing second dopants to first and second source/drains of the semiconductor body, the first source/drain being laterally spaced from the first end of the gate structure, the second source/drain being proximate to or spaced from the second end of the gate structure, wherein one of the first and second dopants are p-type and the other of the first and second dopants are n-type;

providing first dopants to a resurf region extending between the floating region and the first source/drain in the semiconductor body, wherein providing first dopants to the floating region comprises performing a first implantation process to implant p-type dopants into the floating region using a first implantation dose of about 5E12 cm$^{-2}$ or more and wherein the first dopants are p-type and the second dopants are n-type, wherein providing first dopants to the floating region comprises providing a mask exposing the floating region and covering the resurf region while performing the first implantation process; and wherein providing first dopants to the resurf region comprises:

forming a first gate sidewall spacer over the semiconductor body after the first implantation process, the first gate sidewall spacer overlying at least a portion of the floating region and extending laterally outward from the first end of the gate structure; and performing a second implantation process after forming the first gate sidewall spacer to implant p-type dopants into the resurf region using a second implantation dose, the second implantation dose being less than the first implantation dose.

4. The method of claim 3, wherein the second implantation dose is about 5E12 cm$^{-2}$ or less.

5. The method of claim 4, wherein the second implantation dose is about 1E12 cm$^{-2}$ or more and about 4E12 cm$^{-2}$ or less.

* * * * *